United States Patent
Howard et al.

(10) Patent No.: US 7,132,359 B2
(45) Date of Patent: Nov. 7, 2006

(54) TOLERANCE BONDWIRE INDUCTORS FOR ANALOG CIRCUITRY

(75) Inventors: Gregory Eric Howard, Dallas, TX (US); Naveen Yanduru, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 168 days.

(21) Appl. No.: 10/984,150

(22) Filed: Nov. 9, 2004

(65) Prior Publication Data

US 2006/0099792 A1    May 11, 2006

(51) Int. Cl.
*H01L 21/44* (2006.01)

(52) U.S. Cl. ............... 438/617; 438/611; 438/612; 438/613; 438/E21.02; 438/E21.567

(58) Field of Classification Search ............... None
See application file for complete search history.

(56) References Cited

U.S. PATENT DOCUMENTS 6,225,143 B1* 5/2001 Rao et al. ............... 438/106

* cited by examiner

*Primary Examiner*—Dung A. Le
(74) *Attorney, Agent, or Firm*—Yingsheng Tung; Wade James Brady, III; Frederick J. Telecky, Jr.

(57) ABSTRACT

Disclosed are wirebonding methods wherein bondwires are positioned using dynamically determined variations in die placement. Preferred methods of the invention include steps for placing a die on the prepared substrate using selected ideal placement coordinates. Deviation of the actual die placement from the selected ideal placement coordinates is monitored, and one ore more critical bondwires are wirebonded between respective die pins and pins on the substrate. The monitored placement deviation is used to dynamically position the critical bondwires on the critical pins according to actual die placement. Disclosed embodiments include methods using lateral deviation monitoring and angular deviation monitoring to dynamically position bondwires.

8 Claims, 1 Drawing Sheet

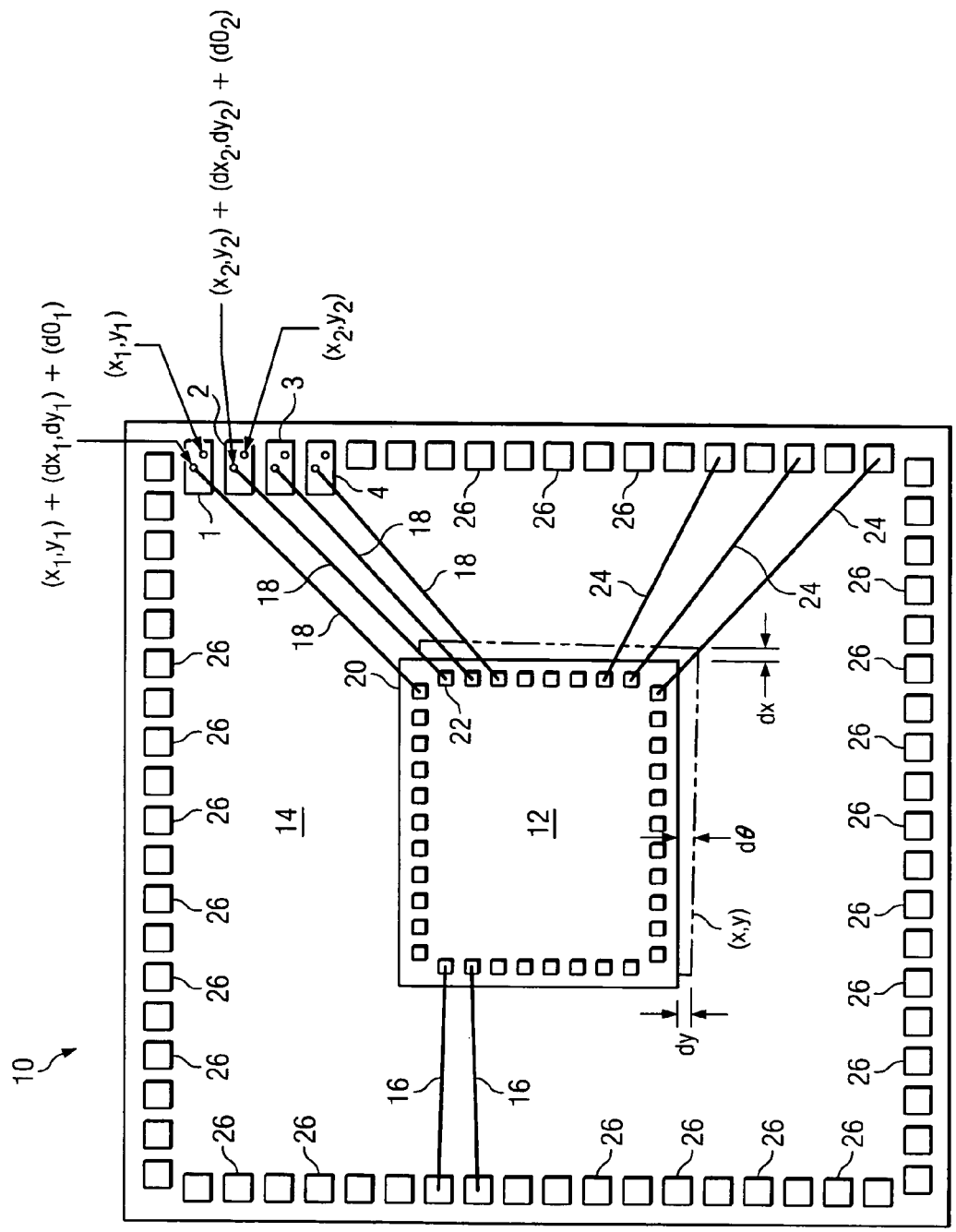

TOLERANCE BONDWIRE INDUCTORS FOR ANALOG CIRCUITRY

TECHNICAL FIELD

The invention relates to integrated circuits (ICs). More particularly, the invention relates to methods for making precision inductors from bondwires in high-performance ICs.

BACKGROUND OF THE INVENTION

High precision bondwire inductors are often required in the design of high-speed analog circuits. Wireless communications applications, for example, demand high performance radio frequency integrated circuits (RFICs). Often RFICs require on-chip inductors as circuit elements. A typical voltage controlled oscillator (VOC) design for RF transmission, for instance, requires an inductor and a capacitor in a tank circuit. When the inductor is a bondwire, as is typical in many RF oscillator designs, the variation in the geometrical configuration of the bondwire is approximately five to ten percent when a standard wirebonding process is used. This variation can be detrimental to the operational characteristics of the bondwire inductor.

In a typical wirebonding situation, an effort is made to place the die onto a package substrate exactly where needed. When the die is placed, there is generally a variation between the intended location and the actual location of the placement. This variation from ideal placement may differ from die to die. The main contributor to the geometric variation in wirebonds is due to these variations in die placement. Actual die placement can typically vary from the intended placement transversely plus/minus fifty microns, and as much as three or four degrees rotationally. This variation is generally sufficient to alter the characteristics of a wirebond inductor. After a die has been placed, automated wirebonding machinery uses alignment markers included on the die and/or package substrate in order to position wirebonds. This leaves the wirebond links and orientations subject to the variations in die placement, as the wirebonding is performed based on an assumption of exact placement in the intended location. Due to these and other problems, improved wirebonding accuracy and a reduction in wirebond variation due to variation in die placement would be useful and advantageous in the arts.

SUMMARY OF THE INVENTION

In carrying out the principles of the present invention, in accordance with preferred embodiments thereof, wirebonding methods are disclosed wherein bondwires are positioned using dynamically determined variations in die placement.

According to one aspect of the invention, a preferred method of wirebonding includes steps for placing a die on the prepared substrate using selected ideal placement coordinates. Deviation of the actual die placement from the selected ideal placement coordinates is monitored, and at least one critical bondwire is wirebonded between a die pin and a critical pin on the substrate using the monitored deviation to dynamically position the critical bondwire on the critical pin according to actual die placement.

According to another aspect of the invention, a method of wirebonding includes a step of wirebonding at least one non-critical bondwire between a die pin and a substrate pin according to the selected ideal placement coordinates.

According to another aspect of the invention, a method of wirebonding includes a step of providing a prepared substrate with at least one enlarged stitchpad for at least one critical pin.

According to still another aspect of the invention, a method of wirebonding includes the steps of monitoring lateral deviation from ideal placement and using the monitored lateral deviation to dynamically position at least one critical bondwire.

According to another aspect of the invention, a method of wirebonding includes the steps of monitoring angular deviation from ideal placement and using the monitored angular deviation to dynamically position at least one critical bondwire.

According to yet another aspect of the invention, a method of wirebonding includes steps for placing a die on a prepared substrate using selected ideal placement coordinates. The lateral and angular deviation of the actual die placement from the selected ideal placement coordinates is monitored. At least one critical bondwire is wirebonded between a selected die pin and a selected critical pin on the substrate using the monitored lateral and angular deviation to dynamically position the critical bondwire according to actual die placement.

The invention has numerous advantages including but not limited to providing methods and devices for the implementation of improved wirebonding and improved bondwire inductors for analog electronic circuits. These and other features, advantages, and benefits of the present invention can be understood by one of ordinary skill in the arts upon careful consideration of the detailed description of representative embodiments of the invention in connection with the accompanying drawing.

BRIEF DESCRIPTION OF THE DRAWING

The present invention will be more clearly understood from consideration of the following detailed description and drawing in which:

The FIGURE is a simplified conceptual top view illustrating examples of preferred methods and devices of the invention.

References in the detailed description correspond to like references in the FIGURE unless otherwise noted. Descriptive and directional terms used in the written description such as first, second, top, bottom, upper, side, etc., refer to the drawing as laid out on the paper and not to physical limitations of the invention unless specifically noted. The drawing is not to scale, and some features of embodiments shown and discussed are simplified or amplified for illustrating the principles, features, and advantages of the invention.

DETAILED DESCRIPTION OF PREFERRED EMBODIMENTS

In general, the invention provides methods and devices providing improved precision in wirebonding by dynamically taking into account the variation in die placement and implementing bondwire attachment accordingly.

Referring to the sole FIGURE, an example of a preferred embodiment of the invention is described. An IC assembly 10 having a die 12 and substrate 14 is shown. For the purposes of illustration, the ideal position of die placement is described herein in terms of x and y coordinates on a Cartesian plane. Planar variation from the intended (x, y)

location is herein denoted by (dx, dy), and departure from a perpendicular orientation is denominated angular displacement, dθ.

Using wirebonding machinery and techniques known in the arts, after a die 12 has been placed on the substrate 14, various alignment markers (not shown) are typically included on the die 12 and/or package substrate 14 are used to position wirebonds, e.g., 16. According to the invention, the actual placement of the die 12 is taken into account in order to determine the variation from the intended placement (x, y). Preferably, the wirebonding machinery is programmed to use specific (dx, dy) and dθ calculated for every one of the critical bondwires 18, and to use relative bondwire placement for the critical bondwires 18. To facilitate the relative bondwire placement for the critical bondwires 18, stitch pad 1, 2, 3, 4, location data is preferably provided to the bonding machine prior to bonding, but after die placement, e.g.; the stitch pad centers used to determine the bondwire replacements would be updated to the new stitch pad centers for the critical wires that includes the relative (dx, dy) and dθ information. Preferably, non-critical bondwires, e.g., those not requiring a high degree of precision, are placed and wirebonded using the alignment markers and the intended (x, y) placement.

An example of this approach is shown for the bondwire attachments in the FIGURE. Thus, if the intended critical stitch pad location for stitch pad 1 is for example (x1, y1), and the relative die translation and rotation are (dx1, dy1) and dθ1 respectively for the die pad 20 associated with the stitch pad 1, the new center of the stitch pad 1 becomes (x1, y1)+(dx1+dy1), offset by dθ1. Similarly, for stitch pad 2, if the intended location is for example (x2, y2), and the relative die translation and rotation are (dx2, dy2) and dθ2 for the die pad 22 associated with the stitch pad 2, the new center of the stitch pad 2 becomes (x2, y2)+(dx2+dy2), offset by dθ2. Similarly the wirebonds for any number of additional critical wires and stitch pads, e.g. 3, 4, are dynamically adjusted taking into account actual die placement variation. Preferably the stitch pads 1, 2, 3, 4 for the critical bondwires 18 are enlarged as shown to allow for more flexibility in the dynamically adaptive placement of the new stitch pad centers. This increase in size is preferably determined based on the order of the expected variation in the die placement and on acceptable tolerances for the specific application. For the noncritical pads, e.g., 24, the locations of the stitch pads 26 remain unchanged and bonding is preferably performed expediently using alignment markers.

The methods and devices of the invention provide advantages including but not limited to reduced variation in wirebond geometry and improved manufacturing tolerances. The invention realizes improved quality factors in inductors, improved LNAs, and improved VCO performance. While the invention has been described with reference to certain illustrative embodiments, the methods and systems described are not intended to be construed in a limiting sense. Various modifications and combinations of the illustrative embodiments as well as other advantages and embodiments of the invention will be apparent to persons skilled in the art upon reference to the description and claims.

We claim:

1. A method of wirebonding for use microelectronic circuitry comprising the steps of:
   providing a prepared substrate with at least one enlarged stitchpad for at least one critical pin;
   placing a die on a prepared substrate using selected ideal placement coordinates, the substrate and the die each having a plurality of pins for receiving bondwires;
   monitoring the deviation of the actual die placement from the selected ideal placement coordinates; and
   wirebonding at least one critical bondwire between a selected die pin and a selected critical pin on the substrate using the monitored deviation to dynamically position the critical bondwire according to actual die placement.

2. The method according to claim 1 further comprising the steps of monitoring lateral deviation from ideal placement and using the monitored lateral deviation to dynamically position at least one critical bondwire.

3. The method according to claim 1 further comprising the steps of monitoring angular deviation from ideal placement and using the monitored angular deviation to dynamically position at least one critical bondwire.

4. The method according to claim 1 further comprising the step of wirebonding at least one non-critical bondwire between a die pin and a substrate pin according to the selected ideal placement coordinates.

5. A method of wirebonding for use in analog circuitry comprising the steps of:
   providing a prepared substrate with at least one enlarged stitchpad for at least one critical pin;
   placing a die on the prepared substrate using selected ideal placement coordinates, the die having a plurality of pins;
   monitoring the deviation of the actual die placement from the selected ideal placement coordinates;
   wirebonding at least one critical bondwire between a die pin and a critical pin on the substrate using the monitored deviation to dynamically position the critical bondwire on the critical pin according to actual die placement; and
   wirebonding at least one non-critical bondwire between a die pin and a non-critical substrate pin using the ideal placement coordinates.

6. The method according to claim 5 further comprising the steps of monitoring lateral deviation from ideal placement and using the monitored lateral deviation to dynamically position at least one critical bondwire.

7. The method according to claim 5 further comprising the steps of monitoring angular deviation from ideal placement and using the monitored angular deviation to dynamically position at least one critical bondwire.

8. A method of wirebonding for use in analog circuitry comprising the steps of:
   providing a prepared substrate with at least one enlarged stitchpad for at least one critical pin;
   placing a die on the prepared substrate using selected ideal placement coordinates, the die having a plurality of pins;
   monitoring the lateral and angular deviation of the actual die placement from the selected ideal placement coordinates;
   wirebonding at least one critical bondwire between a die pin and a critical pin on the substrate using the monitored lateral and angular deviation to dynamically position the critical bondwire on the critical pin according to actual die placement; and
   wirebonding at least one non-critical bondwire between a die pin and a non-critical substrate pin using the ideal placement coordinates.

* * * * *